United States Patent
Plößl

(10) Patent No.: US 12,136,692 B2
(45) Date of Patent: Nov. 5, 2024

(54) METHOD OF PRODUCING AN OPTOELECTRONIC COMPONENT AND OPTOELECTRONIC COMPONENT

(71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 571 days.

(21) Appl. No.: 17/419,439

(22) PCT Filed: Dec. 20, 2019

(86) PCT No.: PCT/EP2019/086687
§ 371 (c)(1),
(2) Date: Jun. 29, 2021

(87) PCT Pub. No.: WO2020/144057
PCT Pub. Date: Jul. 16, 2020

(65) Prior Publication Data
US 2022/0077367 A1  Mar. 10, 2022

(30) Foreign Application Priority Data

Jan. 10, 2019 (DE) .......................... 102019100521.3

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0756* (2013.01); *H01L 33/0093* (2020.05);
(Continued)

(58) Field of Classification Search
CPC ... H01L 33/20; H01L 21/02647; H01L 21/20; H01L 21/2003; H01L 21/2018;
(Continued)

(56) References Cited

U.S. PATENT DOCUMENTS 4,774,205 A  9/1988  Choi et al.
9,372,307 B1 *  6/2016  Budd .................. G02B 6/13
(Continued)

FOREIGN PATENT DOCUMENTS

CN       107810564 A    3/2018
DE  10 2009 051 520 A1  5/2011
(Continued)

OTHER PUBLICATIONS

Office Action dated Feb. 1, 2023, of counterpart Korean Patent Application No. 10-2021-7022974, along with a Summary of Office Action in English.
(Continued)

*Primary Examiner* — Sonya McCall-Shepard
(74) *Attorney, Agent, or Firm* — DLA Piper LLP (US)

(57) ABSTRACT

A method of producing an optoelectronic component includes providing a semiconductor wafer with a functional semiconductor layer that has electronic control elements, and a growth layer; generating a plurality of recesses in the semiconductor wafer exposing the growth layer in places; and epitaxially growing a plurality of semiconductor layer stacks on the exposed growth layer, wherein a surface of the exposed growth layer is used as a growth surface for the semiconductor layer stacks, and the growth surface is inclined to a main extension plane of the semiconductor wafer.

14 Claims, 4 Drawing Sheets

(51) Int. Cl.
  *H01L 25/16* (2023.01)
  *H01L 33/00* (2010.01)
  *H01L 33/10* (2010.01)
  *H01L 33/38* (2010.01)
  *H01L 33/44* (2010.01)
  *H01L 33/54* (2010.01)

(52) U.S. Cl.
  CPC .............. *H01L 33/10* (2013.01); *H01L 33/54* (2013.01); *H01L 2933/0066* (2013.01)

(58) Field of Classification Search
  CPC . H01L 21/2022; H01L 21/042; H01L 25/167; H01L 33/0093; H01L 33/62; H01L 2933/0066; H01L 27/1203; H01L 27/1207; H01L 27/153; H01L 21/0243; H01L 21/02433; H01L 33/16; H01L 33/24; H01L 33/10; H01L 33/005; H01L 33/54; H01L 33/44; H01L 25/0756; G02B 6/122; G02B 6/42; G02B 6/43; H01S 5/026
  See application file for complete search history.

(56) References Cited

U.S. PATENT DOCUMENTS

| | | | |
|---|---|---|---|
| 9,653,441 | B1 | 5/2017 | Chen et al. |
| 9,985,192 | B2 * | 5/2018 | Peng .................. H01L 27/1248 |
| 10,770,506 | B2 | 9/2020 | Von Malm et al. |
| 2009/0242935 | A1 | 10/2009 | Fitzgerald |
| 2010/0078680 | A1 | 4/2010 | Cheng et al. |
| 2010/0171135 | A1 | 7/2010 | Engl et al. |
| 2012/0270378 | A1 | 10/2012 | Kittler et al. |
| 2015/0108427 | A1 | 4/2015 | Brueck et al. |
| 2016/0276807 | A1 | 9/2016 | Cai et al. |
| 2018/0190874 | A1 | 7/2018 | Katz et al. |
| 2018/0254384 | A1 | 9/2018 | Hartmann et al. |

FOREIGN PATENT DOCUMENTS

| | | |
|---|---|---|
| DE | 10 2012 109 460 A1 | 4/2014 |
| JP | 2002-026387 A | 1/2002 |
| KR | 10-1419413 | 7/2014 |
| KR | 10-2018-0063058 | 6/2018 |

OTHER PUBLICATIONS

Notification of Reasons for Refusal dated Aug. 3, 2022, of counterpart Japanese Patent Application No. 2021-540179, along with an English translation.

Francois Templier et al., "Breakthrough in Fabricating Active-Matrix GaN Microdisplays," Photonics Spectra, Jan. 2018, pp. 70-74.

Lei Zhang et al., "Wafer-scale monolithic hybrid integration of Si-based IC and III-V epi-layers—A mass manufacturable approach for active matrix micro-LED micro-displays," Journal of the SID, vol. 26, No. 3, Mar. 26, 2018, pp. 137-145.

Notice of Allowance dated Dec. 1, 2023, of counterpart Korean Patent Application No. 10-2021-7022974, along with an English translation.

Examination Report dated Dec. 19, 2023, of counterpart German Patent Application No. 11 2019 006 633.1, along with an English machine translation.

First Office Action dated Aug. 23, 2024, of counterpart Chinese Patent Application No. 201980088661.5, along with an English machine translation.

* cited by examiner

METHOD OF PRODUCING AN OPTOELECTRONIC COMPONENT AND OPTOELECTRONIC COMPONENT

TECHNICAL FIELD

This disclosure relates to a method of producing an optoelectronic component and an optoelectronic component.

BACKGROUND

There is a need to provide a simplified method of producing an optoelectronic component, in particular, an optoelectronic component having a particularly good heat dissipation.

SUMMARY

I provide a method of producing an optoelectronic component including providing a semiconductor wafer with a functional semiconductor layer that has electronic control elements, and a growth layer; generating a plurality of recesses in the semiconductor wafer exposing the growth layer in places; and epitaxially growing a plurality of semiconductor layer stacks on the exposed growth layer, wherein a surface of the exposed growth layer is used as a growth surface for the semiconductor layer stacks, and the growth surface is inclined to a main extension plane of the semiconductor wafer.

I also provide an optoelectronic component including an epitaxial semiconductor layer stack; and a functional semiconductor layer having an electronic control element that controls the semiconductor layer stack, wherein the functional semiconductor layer is arranged adjacent to the semiconductor layer stack, the functional semiconductor layer does not overlap with a first main surface of the semiconductor layer stack in plan view, and the optoelectronic component is free of a growth layer.

Figure 1:
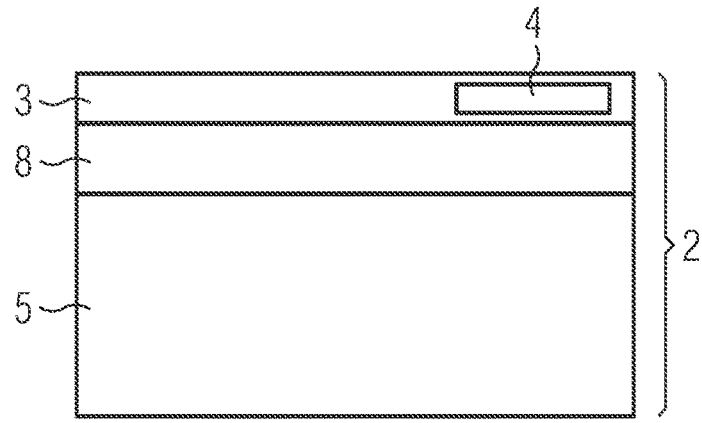
FIGS. 1, 2 and 3 are schematic sectional views of method steps of a method of producing an optoelectronic component according to an example.

REFERENCES 1 optoelectronic component
2 semiconductor wafer
3 functional semiconductor layer
3a top surface of the functional semiconductor layer
4 control element
5 growth layer
5a surface of the exposed growth layer
6 recess
6a bottom surface of recesses
6b side surface of recesses
6c central area of the recess
7 semiconductor layer stack
7a first main surface of the semiconductor layer stack
7b second main surface of the semiconductor layer stack
8 insulating connection layer
9 growth surface
9a first region of the growth surface
9b second region of the growth surface
10 {111} oriented surface
11 barrier layer
11a side surface of the barrier layer
12 reflective layer
13 auxiliary carrier
14 protective layer
15 semiconductor layer sequence
16 electrically conductive connection
17 cavity
17a bottom surface of cavity
17b side surface of cavity
18 contact layer
R red
G green
B blue

DETAILED DESCRIPTION

My method produces a semiconductor wafer with a growth layer and a functional semiconductor layer comprising electronic control elements. The semiconductor wafer preferably has a main extension plane. A lateral direction is preferably aligned parallel to the main extension plane, and a vertical direction is aligned perpendicular to the lateral direction. Preferably, the functional semiconductor layer and the growth layer are stacked on top of one another in a vertical direction. Preferably, the functional semiconductor layer has a lateral extent that is smaller than a lateral extent of the growth layer. Preferably, the semiconductor wafer has the shape of a disk. The disc preferably has a diameter that is at least 150 millimeters and at most 350 millimeters. For example, the semiconductor wafer has a thickness of at least 10 nanometers to at most 2000 nanometers, in particular of at least 100 nanometers to at most 1500 nanometers, of at least 50 nanometers to at most 200 nanometers or of at least 12 nanometers to at most 15 nanometers. For example, a thickness of the functional semiconductor layer is at least 5 nanometers to at most 2000 nanometers.

The functional semiconductor layer preferably comprises Si or GaN. The growth layer preferably comprises or consists of Si or GaN.

For example, at least one of the control elements is embedded in the functional layer. "Embedded" can mean that the control element is partially inside the functional layer and/or is enclosed by the functional layer on at least part of its outer surface. Preferably, the control element is completely enclosed by the functional layer except for at least one contact surface.

A plurality of recesses may be generated in the semiconductor wafer that expose the growth layer in places. The recesses are generated, for example, by removing the material of the semiconductor wafer. The recesses are generated, for example, by a chemical etching process or a laser process. The recesses preferably extend in vertical direction. The recesses are preferably created starting from the functional semiconductor layer.

The recesses preferably penetrate the functional semiconductor layer completely. In this example, side surfaces of the recesses are preferably formed by an exposed side surface of the functional semiconductor layer. Furthermore, it is possible that the recesses partially penetrate the growth layer. The recesses are preferably created starting from the functional semiconductor layer, preferably penetrate the functional semiconductor layer completely and extend into the growth layer. The side surfaces of the recesses are each preferably formed by an exposed side surface of the functional semiconductor layer and an exposed side surface of the growth layer. Furthermore, a bottom surface of the recesses is formed by the growth layer.

The recesses are preferably arranged in a matrix-like manner, that is, along columns and rows. Preferably, the recesses are arranged at grid points of a regular pattern. The regular pattern can be a triangular pattern, a rectangular pattern, a hexagonal pattern or a polygonal pattern. The recesses are preferably arranged laterally spaced apart from one another. The recesses each preferably have a triangular, a rectangular, a hexagonal, a round shape, an oval shape or an elliptical shape. A maximum extension in the lateral direction of the recesses is preferably at least 50 nanometers and at most 100 micrometers, particularly preferably at least 200 nanometers to at most 5000 nanometers, in particular at least 500 nanometers to at most 2500 nanometers.

A plurality of semiconductor layer stacks may be epitaxially grown on the exposed growth layer. Preferably, one semiconductor layer stack is formed in each recess of the plurality of recesses. Preferably, the semiconductor layer stacks completely fill each of the recesses.

For example, the semiconductor layer stacks are based on an III-V compound semiconductor material. The III-V compound semiconductor material is, for example, a phosphide compound semiconductor material. Phosphide compound semiconductor materials are compound semiconductor materials containing phosphorus such as the materials from the system $In_xAl_yGa_{1-x-y}P$ with $0 \leq x \leq 1$, $0 \leq y \leq 1$ and $x+y \leq 1$.

The III-V compound semiconductor material can also be an arsenic compound semiconductor material. Arsenic compound semiconductor materials are compound semiconductor materials containing arsenic such as the materials from the system $In_xAl_yGa_{1-x-y}As$ with $0 \leq x \leq 1$, $0 \leq y \leq 1$ and $x+y \leq 1$.

The III-V compound semiconductor material can also be an antimonide compound semiconductor material. Antimony compound semiconductor materials are compound semiconductor materials containing antimony such as the materials from the system $In_xAl_yGa_{1-x-y}Sb$ with $0 \leq x \leq 1$, $0 \leq y \leq 1$ and $x+y \leq 1$.

Preferably, the III-V compound semiconductor material is a nitride compound semiconductor material. Nitride compound semiconductor materials are compound semiconductor materials containing nitride such as the materials from the $In_xAl_yGa_{1-x-y}N$ system with $0 \leq x \leq 1$, $0 \leq y \leq 1$ and $x+y \leq 1$.

The semiconductor layer stacks can have dopants as well as additional constituents. For the sake of simplicity, however, only the essential constituents of the crystal lattice of the semiconductor layer stacks, i.e., Al, Ga, In, N, As, Sb or P, are indicated, even if they may be partially replaced and/or supplemented by small amounts of further substances.

The semiconductor layer stacks may each comprise an active zone that generates or detects electromagnetic radiation during operation. The electromagnetic radiation generated during operation of the active zones can be near-ultraviolet radiation, visible light and/or near-infrared radiation. Alternatively, it is possible that the electromagnetic radiation detected during operation of the active zones is near-ultraviolet radiation, visible light and/or near-infrared radiation.

If the optoelectronic component is configured to generate electromagnetic radiation, the optoelectronic component is, for example, a light emitting diode chip or a laser diode. If the optoelectronic component is configured to detect electromagnetic radiation, the optoelectronic component is, for example, a photodetector.

The method of producing an optoelectronic component may comprise the steps of:
providing a semiconductor wafer comprising a functional semiconductor layer having electronic control elements and a growth layer;
generating a plurality of recesses in the semiconductor wafer exposing the growth layer in places; and
epitaxially growing a plurality of semiconductor layer stacks on the exposed growth layer.

An idea of the method of producing an optoelectronic component described herein is, inter alia, to provide a semiconductor wafer comprising a functional semiconductor layer and a growth layer. Epitaxial semiconductor layer stacks can thus advantageously be produced without complex transfer processes of semi-finished products in the recesses of the functional semiconductor layer. Advantageously, the semiconductor layer stacks can each be assigned to one or more electronic control elements of the functional semiconductor layer. A complex adjustment of the semiconductor layer stacks on the control elements is advantageously omitted. When the cross-sectional area of the recesses is comparatively small in the lateral direction, the semiconductor layer stacks can also have comparatively small cross-sectional areas. Advantageously, very low dislocation densities can thus be achieved in the semiconductor layer stacks.

Furthermore, a compact optoelectronic component can be produced in a simplified manner by such a method in which a plurality of semiconductor layer stacks are used next to one another. Advantageously, the component can be, for example, a miniaturized display (micro display) whose semiconductor layer stacks can be controlled in a fast manner. Furthermore, the producing process advantageously reduces distortions due to strain.

At least one electronic control element may comprise an integrated circuit. For example, an electronic control element can be associated with each of the semiconductor layer stacks. Alternatively, it is possible that several semiconductor layer stacks are assigned to one electronic control element or that one electronic control element is assigned to all semiconductor layer stacks. Furthermore, it is possible that all semiconductor layer stacks can be controlled separately from one another by a single electronic control element.

The integrated circuit is formed, for example, by an integrated circuit (IC) or has such an integrated circuit. The integrated circuit comprises, for example, a control unit, an evaluation unit and/or a drive unit. The control unit and the evaluation unit each read and check, for example, the state of the associated semiconductor layer stacks. The control unit can, for example, control the state of an associated semiconductor layer stack and, for example, switch it on or off.

The semiconductor layer stacks formed as a photodetector can be read out, for example, by the integrated circuit such as the control unit and the evaluation unit. The semiconductor layer stacks formed as light-emitting diodes can be controlled, for example, by the integrated circuit or the control unit.

An insulating connection layer may be arranged between the functional semiconductor layer and the growth layer. The insulating connection layer is preferably in fully and direct contact with the functional semiconductor layer and the growth layer. The insulating connection layer preferably provides a mechanically stable connection between the functional semiconductor layer and the growth layer. The insulating connection layer preferably comprises or consists of $SiO_2$.

Preferably, the recesses completely penetrate the insulating connection layer. In this example, the side surfaces of the recesses are each formed by an exposed side surface of the functional semiconductor layer, an exposed side surface of the growth layer and an exposed side surface of the insulating connection layer. Alternatively, the side surfaces of the recesses are each formed by an exposed side surface of the functional semiconductor layer and an exposed side surface of the insulating connection layer. In this example, the recesses do not penetrate the growth layer.

A surface of the exposed growth layer may be used as a growth surface for the semiconductor layer stacks. The bottom surface of the recesses preferably forms the surface of the exposed growth layer. The semiconductor layer stacks can preferably be epitaxially deposited on the growth surface. The semiconductor layer stacks are preferably epitaxially grown on the exposed growth layer by chemical vapor deposition.

The growth surface may have or may be a $\{111\}$ oriented surface. Generally, directions in a crystal lattice are uniquely defined by Miller's indices h, k, l. Furthermore, the directions h, k, l can be used to define a crystal plane group (hkl). This means that a crystal plane group (hkl) is uniquely defined by the Miller indices. By the notation $\{hkl\}$, all symmetrically equivalent crystal planes are preferably meant. Preferably, the semiconductor layer stacks can be grown exclusively on a $\{111\}$ oriented surface.

The functional semiconductor layer preferably has a $\{100\}$ oriented surface, wherein the $\{100\}$ oriented surface of the functional semiconductor layer preferably extends parallel to the main extension plane of the semiconductor wafer. The semiconductor layer stacks based on a III-V compound semiconductor material preferably cannot grow or can grow only very poorly on the $\{100\}$ oriented surface.

Alternatively, the functional semiconductor layer can have a $\{111\}$ oriented surface. In this example, the functional semiconductor layer is deposited on the growth layer with the growth surface during a production of the semiconductor wafer. The crystal orientations of the functional semiconductor layer and the growth layer are preferably oriented substantially the same. "Substantially" means that the crystal orientations can be twisted around a surface normal in the vertical direction. For example, the crystal orientations of the functional semiconductor layer and the growth layer can differ by an angle of at least 0.1° to at most 0.5°. Thus, the crystal orientations of the semiconductor layer stacks and the functional semiconductor layer can also differ around the surface normal by an angle of at least 0.1° to at most 0.5°.

The crystal orientations of the semiconductor layer stacks can preferably be oriented the same with a deviation of 0.04° around the surface normal.

The growth surface may extend parallel to the main extension plane of the semiconductor wafer. In this example, the growth layer generally has the $\{111\}$ oriented surface arranged parallel to the main extension plane of the semiconductor wafer. The exposed growth surface usually serves as the starting surface of the epitaxial process for epitaxially growing the semiconductor layer stacks. Preferably, the semiconductor layer stacks grow completely on the growth surface.

The growth surface may be inclined with respect to the main extension plane of the semiconductor wafer. The inclined growth surface may be generated by an anisotropic etching process. Prior to generating the inclined growth surface, the growth layer has a $\{100\}$ oriented surface parallel to the main extension plane of the semiconductor wafer. That is, by applying the anisotropic etching process, the $\{111\}$ oriented surface is created. Depending on the crystal system of the growth layer, the growth surface can have an angle to the main extension plane of the semiconductor wafer which is at least 10° and at most 80°.

Preferably, the inclined growth surface of a recess has a first region and a second region. For example, the inclined growth surface in the first region extends from a first side surface of the recess in the first region into a central region of the recess. Furthermore, the inclined growth surface in the second region preferably extends from a second side surface of the recess opposite the first side surface in the second region into the central region of the recess. The growth surface preferably has the shape of a wedge in cross-section. The opposing surfaces of the growth surface preferably enclose an angle that is smaller than 160° to greater than 20°.

A cavity may be created in the growth layer in each of the recesses, preferably starting from the bottom surface of the recess. The cavities each preferably have a smaller cross-sectional area in the lateral direction than a recess. In this example, the remaining bottom surface of the recesses and the lateral surfaces of the cavities each have the shape of a step. In other words, the remaining bottom surface of a recess and the side surface of the cavity formed in the bottom surface of the recess preferably adjoin one another such that an edge is formed.

Preferably, the growth surface is smoothed after the generation. For example, the growth surface having the $\{111\}$ oriented surface is smoothed by a hydrofluoric acid solution, preferably buffered with an ammonium fluoride. Advantageously, after such treatment, the growth surface is generally atomically flat and free of steps. Advantageously, this suppresses inversion domains during epitaxial growth of the semiconductor layer stacks.

A barrier layer may be deposited over a side surface of the recesses. Preferably, the barrier layer is applied on the side surfaces of the recesses before the semiconductor layer stacks are formed. Preferably, the barrier layer completely covers the side surfaces of the recesses. Further, the barrier layer can completely cover the side surfaces of the recesses and the side surfaces of the cavities. For example, the barrier layer comprises or is formed from AlN, $SiO_2$ or $Si_3N_4$. Advantageously, the barrier layer prevents migration of impurity atoms into the epitaxial semiconductor layer stacks during their growth.

If the recesses each have a cavity, the remaining bottom surface of the recesses and the side surfaces of the cavities are preferably covered with the barrier layer. A bottom surface of the cavity preferably forms the growth surface of the growth layer for the semiconductor layer stacks. In this example, the growth surface preferably extends inclined to the main extension plane of the semiconductor wafer.

If the bottom surface of the cavity forms the growth surface of the growth layer, the growth surface is comparatively small. For example, the growth surface of the semiconductor layer stack is comparatively small compared to the cross-sectional area in the lateral direction of the recesses and thus of the resulting semiconductor layer stack.

For example, an area of the growth surface is at least 0.2 smaller than the cross-sectional area in the lateral direction of the recesses. Preferably, the area of the growth surface is at least 0.4 smaller than the cross-sectional area in the lateral direction of the recesses. Advantageously, a comparatively low-defect such as dislocation-free, epitaxial growth of the semiconductor layer stacks can thus be achieved.

Alternatively, it is possible that the growth surface is comparatively large. For example, the growth surface of the semiconductor layer stacks is comparatively large compared to the cross-sectional area in the lateral direction of the recesses. In this example, the recess is removed by an etching process, wherein the growth layer is under-etched and thus has a comparatively large cross-sectional area.

A reflective layer may be applied over a side surface of the recess. Preferably, the reflective layer is applied on the side surfaces of the recesses before the semiconductor layer stacks are formed. Preferably, the reflective layer completely covers the side surfaces of the recesses. Further, the reflective layer can completely cover the side surfaces of the recesses and the side surfaces of the cavities. Preferably, the reflective layer is applied before the barrier layer is applied.

If the reflective layer is applied before the barrier layer is applied, the barrier layer is preferably transparent to the generated electromagnetic radiation.

Alternatively, it is possible that the reflective layer is applied on the barrier layer after the barrier layer has been applied. In this example, the reflective layer completely covers the barrier layer.

The reflective layer is configured to reflect electromagnetic radiation of the semiconductor layer stacks. The reflective layer preferably has a reflectivity of at least 90%, in particular 95% or 99%, for the generated electromagnetic radiation.

The reflective layer is, for example, a metallic reflector and preferably comprises or consists of a metal. For example, the reflective layer comprises or consists of at least one of the following metals: silver, aluminium, rhodium, nickel, copper or gold.

Alternatively, it is possible that the reflective layer is a Bragg mirror comprising alternating layers of a high refractive index material and a low refractive index material. In this example, the reflective layer is electrically insulating and comprises or consists of, for example, dielectric materials.

Furthermore, the reflective layer can be a combination of metallic materials and dielectric materials.

The growth layer may be removed such that the first main surfaces of the semiconductor layer stacks are exposed. Preferably, the first main surfaces of the semiconductor layer stacks are arranged opposite the second main surfaces. Preferably, the growth layer is completely removed. In addition to the growth layer, preferably a portion of the semiconductor layer stacks is also removed. The semiconductor layer stacks are then preferably planarized.

The growth layer and a part of the semiconductor layer stacks are preferably removed such that the first main surfaces are arranged in a common plane with a bottom surface of the insulating connection layer. Preferably, the growth layer and/or a part of the semiconductor layer stacks is removed by mechanical grinding and/or polishing, for example, by chemo-mechanical polishing. In this example, the first main surfaces have grinding and/or polishing marks.

Alternatively, the growth layer and/or a part of the semiconductor layer stacks are removed by a chemical etching process. In this example, the insulating connection layer is preferably formed as an etch stop layer.

Furthermore, it is possible that the insulating connection layer is completely removed.

Preferably, the semiconductor layer stacks are planarized after the epitaxial growth. In this example, the semiconductor layer stacks have second main surfaces facing away from the growth layer. It is possible that a top surface of the functional semiconductor layer and the second main surfaces are arranged in a common plane. Preferably, the planarization is produced by mechanical grinding and/or polishing. In this example, the second main surfaces have planarization traces.

The semiconductor layer stacks may be arranged on an auxiliary carrier before the growth layer is removed. In this example, the semiconductor layer stacks are preferably applied with the second main surfaces on the auxiliary carrier.

A protective layer may be applied on the functional semiconductor layer before the recess is generated. Preferably, the protective layer is applied on the top surface of the functional semiconductor layer facing away from the growth layer. The recesses are preferably generated in the semiconductor wafer after the application of the protective layer. The recesses completely penetrate the protective layer and the functional semiconductor layer. Preferably, the recesses completely penetrate the protective layer, the functional semiconductor layer and the insulating connection layer. Preferably, the protective layer comprises $SiO_2$ or consists thereof.

An epitaxial semiconductor layer sequence may be deposited by lateral overgrowth of the protective layer. In this example, it is possible that the semiconductor layer stacks do not completely fill the recesses. The second main surfaces are arranged, for example, in a vertical direction in the region of the protective layer. The second main surfaces thereby preferably form a further growth surface for the semiconductor layer sequence. The semiconductor layer sequence that is applied on the second main surfaces, for example, can connect to one another in the lateral direction above the protective layer between adjacent semiconductor layer stacks. The epitaxial semiconductor layer sequence thus overgrows the protective layer in the lateral direction.

The semiconductor layer sequence is preferably based on a III-V compound semiconductor material described in connection with the semiconductor layer stacks.

Subsequently, the epitaxial semiconductor layer sequence can be structured. For example, the epitaxial semiconductor layer sequence can be structured using a wet chemical process, a dry chemical process or a laser process. Furthermore, it is possible that several of the following processes can be combined: wet chemical process, dry chemical process and laser process. The structured semiconductor layer sequence can comprise elements arranged in a matrix-like manner, i.e., along columns and rows. Preferably, the elements of the structured semiconductor layer sequence are arranged at lattice points of a regular pattern. Preferably, the elements of the structured semiconductor layer sequence are arranged laterally spaced apart from one another.

An electronic control element can be assigned to each element of the structured semiconductor layer sequence. Alternatively, it is possible that several elements of the structured semiconductor layer sequence are assigned to one electronic control element, or that one electronic control element is assigned to all elements of the structured semiconductor layer sequence. Furthermore, it is possible that all elements of the structured semiconductor layer sequence can be controlled separately from one another by the at least one electronic control element.

Furthermore, a contact layer can be applied over the semiconductor layer sequence. Preferably, the contact layer comprises or consists of a transparent conductive oxide (TCO).

Electrically conductive connections may be applied on the semiconductor layer stacks and the functional semiconductor layer that electrically conductively connect the semiconductor layer stacks and the functional semiconductor layer to one another.

If the optoelectronic component comprises only the semiconductor layer stacks, the electrically conductive connections can be applied on the second main surfaces of the semiconductor layer stacks. In this example, the electrically conductive connections electrically conductively connect the second main surfaces of the semiconductor layer stacks to the functional semiconductor layer.

If the optoelectronic component has the semiconductor layer sequence, the electrically conductive connections can be applied on the first main surfaces of the semiconductor layer stacks. In this example, the electrically conductive connections electrically conductively connect the first main surfaces of the semiconductor layer stacks to the functional semiconductor layer. Alternatively, the electrically conductive connections can be applied on the semiconductor layer sequence. In this example, the electrically conductive connections electrically conductively connect the semiconductor layer sequence to the functional semiconductor layer.

If the contact layer is also applied on the semiconductor layer sequence, the contact layer can be electrically conductively connected to the functional semiconductor layer by one of the electrically conductive connections.

Furthermore, an opaque cover can be arranged on the electrically conductive connections. Preferably, this happens when the electrically conductive connections electrically conductively connect the second main surfaces of the semiconductor layer stacks to the functional semiconductor layer. Advantageously, the electronic control element is thus protected from disturbances induced by light.

Furthermore, I provide an optoelectronic component that can be produced by the methods described herein. Any features and configurations disclosed in connection with the method can therefore also be formed in connection with the optoelectronic component, and vice versa.

The optoelectronic component may comprise an epitaxial semiconductor layer stack.

The optoelectronic component may comprise a functional semiconductor layer having an electronic control element for controlling the semiconductor layer stack.

The functional semiconductor layer may be arranged adjacent to the semiconductor layer stack. In this example, the functional semiconductor layer is arranged spaced apart from the semiconductor layer stack in the lateral direction.

The functional semiconductor layer need not overlap with a first main surface of the semiconductor layer stack in plan view. Advantageously, the functional semiconductor layer is thermally decoupled from the semiconductor layer stack so that occurring heat losses of the functional semiconductor layer and the semiconductor layer stack are not added over the same surface element in plan view. Such an optoelectronic component advantageously exhibits improved heat dissipation.

The first main surface may be formed as a radiation transmission surface. The first main surface generally has traces produced by a grinding and/or polishing process or an etching process.

The semiconductor layer stack may comprise an active zone that generates or detects electromagnetic radiation during operation. For example, the semiconductor layer stack emits light of red, yellow, green or blue color. Further, the optoelectronic component can comprise a plurality of semiconductor layer stacks. In this example, the semiconductor layer stacks are grouped into sub-pixels, each comprising, for example, three semiconductor layer stacks, each preferably emitting light of red, green and blue color.

A sub-pixel preferably comprises three semiconductor layer stacks, wherein one semiconductor layer stack emits light of blue color, one semiconductor layer stack emits light of green color, and one semiconductor layer stack emits light of red color. The three semiconductor layer stacks of the sub-pixel can be arranged at the corners of a triangle.

Further, it is possible for a plurality of sub-pixels to be arranged in a matrix-like manner, that is, along columns and rows. Preferably, the plurality of sub-pixels is arranged at grid points of a regular pattern. The regular pattern can be a triangular pattern, a rectangular pattern, a hexagonal pattern or a polygonal pattern.

An epitaxial semiconductor layer sequence may be arranged over the epitaxial semiconductor layer stack and the functional semiconductor layer. In this example, the epitaxial semiconductor layer sequence comprises an active zone which generates or detects electromagnetic radiation during operation. Preferably, the semiconductor layer sequence completely overlaps with the semiconductor layer stack in plan view. Furthermore, the epitaxial semiconductor layer sequence partially overlaps with the functional semiconductor layer.

A protective layer may be arranged between the functional semiconductor layer and the epitaxial semiconductor layer sequence.

Furthermore, a barrier layer can be arranged between the functional semiconductor layer and the semiconductor layer stack. Additionally, a reflective layer can be arranged between the functional semiconductor layer and the semiconductor layer stack. The reflective layer can be arranged between the semiconductor layer stack and the barrier layer or between the barrier layer and the functional semiconductor layer.

For example, the barrier layer is formed multilayered. In this example, it is possible that the reflective layer is arranged between two layers of the barrier layer.

Furthermore, it is possible that the reflective layer preferably completely surrounds the semiconductor layer stack. For example, the reflective layer completely covers a bottom surface of the insulating connection layer. The first main surface is thereby preferably free of the reflective layer.

Furthermore, it is possible that the barrier layer preferably completely surrounds the semiconductor layer stack. In this example, the barrier layer completely covers a bottom surface of the insulating connection layer. The first main surface is thereby preferably free of the barrier layer.

In the following, the method of producing the optoelectronic component and the optoelectronic component are explained in more detail with reference to examples.

Elements that are identical, similar or have the similar acting are given the same reference signs in the Figures. The Figures and the proportions of the elements shown in the Figures are not to be regarded as true to scale. Rather, individual elements can be shown exaggeratedly large for better representability and/or for better comprehensibility.

Figure 2:
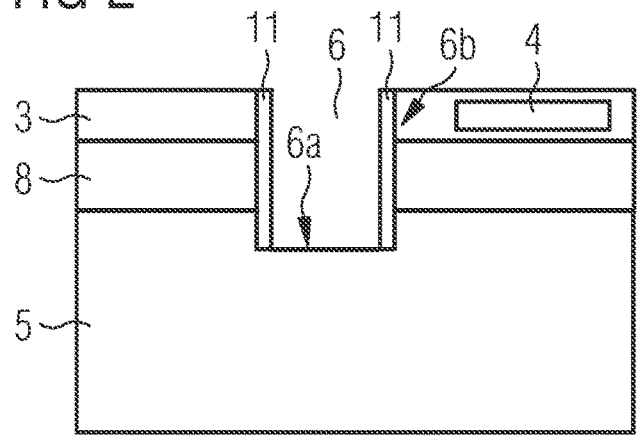
Figure 3:
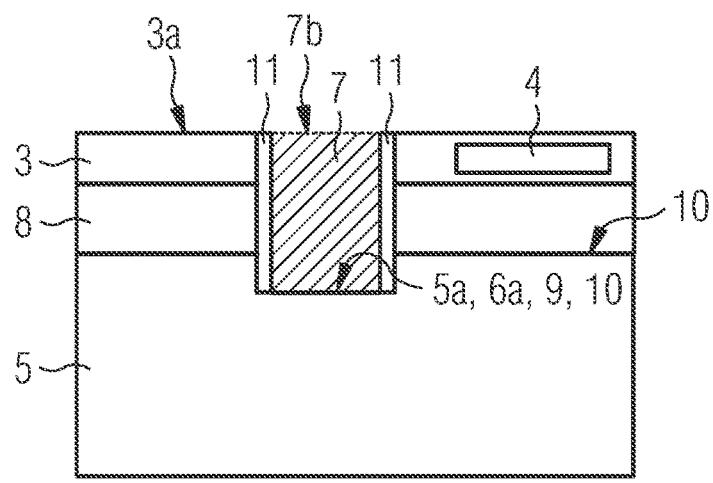

In the method according to the example of FIGS. 1, 2 and 3, as shown in FIG. 1, a semiconductor wafer 2 is provided with a functional semiconductor layer 3 comprising electronic control elements 4. Furthermore, the semiconductor wafer 2 comprises a growth layer 5 and an insulating connection layer 8. The insulating connection layer 8 is arranged between the functional semiconductor layer 3 and the growth layer 5 and provides a mechanically stable connection between the functional semiconductor layer 3 and the growth layer 5. The insulating connection layer 8 is preferably formed by $SiO_2$.

According to FIG. 2, in a next method step, a plurality of recesses 6 are generated in the semiconductor wafer 2 (only a single recess 6 of the recesses 6 is shown by way of example) that expose the growth layer 5 in places. The recesses 6 are generated starting from the functional semiconductor layer 3. The recesses 6 completely penetrate the functional semiconductor layer 3 and the insulating connection layer 8.

Furthermore, the recesses 6 partially penetrate the growth layer 5. Side surfaces of the recesses 6b are respectively formed by an exposed side surface of the functional semiconductor layer 3, an exposed side surface of the growth layer 5 and an exposed side surface of the insulating connection layer 8. Furthermore, a bottom surface of the recesses 6a is formed by the growth layer 5.

A barrier layer 11 is applied over the side surfaces of the recesses 6b. The barrier layer 11 completely covers the side surface of the recesses 6b. The barrier layer 11 comprises, for example, AlN or is formed thereof.

In a next method step as shown in FIG. 3, a plurality of semiconductor layer stacks 7 are epitaxially grown on the exposed growth layer 5.

The semiconductor layer stacks 7 each comprise an active zone that generates or detects electromagnetic radiation during operation. The semiconductor layer stacks 7 each completely fill the recesses 6.

The semiconductor layer stacks 7 are preferably planarized after growth, for example, by mechanical grinding and/or polishing. The semiconductor layer stacks 7 have second main surfaces 7b facing away from the growth layer 5. A top surface of the functional semiconductor layer 3a and the second main surfaces 7b are arranged in a common plane.

A surface of the exposed growth layer 5a is used as a growth surface 9 for the semiconductor layer stacks 7. The bottom surface of the recesses 6a forms the surface of the exposed growth layer 5a. The semiconductor layer stacks 7 are epitaxially deposited on the growth surface 9. The growth surface 9 has a {111} oriented surface 10.

In this example, the growth surface 9 extends parallel to a main extension plane of the semiconductor wafer 2. That is, the growth layer 5 has or consists of the {111} oriented surface 10 which is arranged parallel to the main extension plane of the semiconductor wafer 2.

Subsequently, the growth layer 5 and a part of the semiconductor layer stacks 7 can be removed so that first main surfaces 7a of the semiconductor layer stacks are exposed (not shown here).

Figure 4:
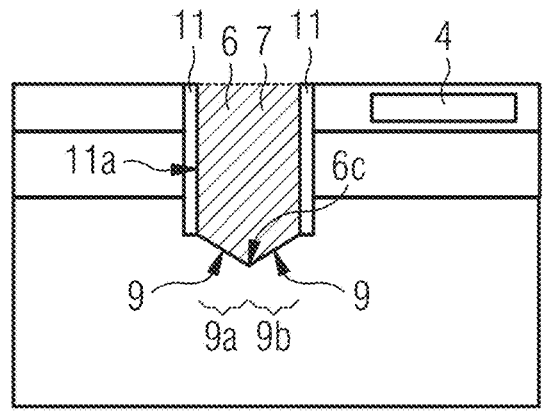
FIGS. 4 and 5 are schematic sectional views of method steps of a method of producing an optoelectronic component according to an example.

In the method according to the example of FIG. 3, the method steps are initially carried out as already described with reference to FIG. 1. In the next method step, the recesses 6 are generated, which have an inclined bottom surface in contrast to the process stage of FIG. 3. Consequently, the growth surface 9 in the method stage according to FIG. 4 is inclined to the main extension plane of the semiconductor wafer 2. In this example, the growth layer 5 has a {100} oriented surface which is arranged parallel to the main extension plane of the semiconductor wafer 2.

The inclined growth surface 9 has a first region 9a and a second region 9b as seen in cross-section in the region of a recess 6. The inclined growth surface 9 extends in the first region 9a from a side surface of the barrier layer 11a in the first region 9a into a central region of the recess 6c. Further, in the second region 9b, the inclined growth surface 9 extends from an opposite side surface of the barrier layer 11a in the second region of the growth surface 9b into the central region of the recess 6c. In cross-section, the growth surface 9 has the shape of a wedge.

Figure 5:
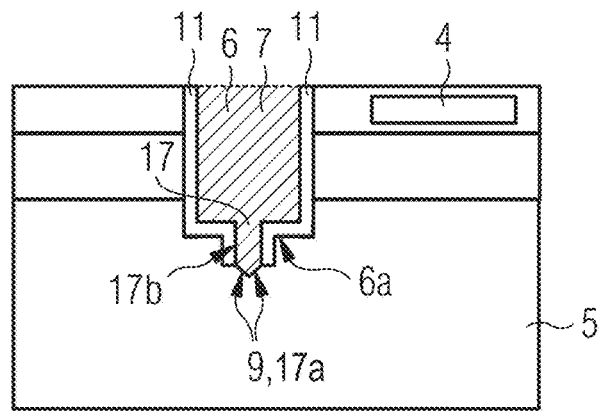

In the process according to the example of FIG. 5, in contrast to the example of FIG. 4, cavities 17 are generated in each of the recesses 6 in the growth layer 5. The cavities 17 each have a smaller cross-sectional area in the lateral direction than a recess 6. The remaining bottom surface of the recesses 6a and side surfaces of the cavities 17b have the shape of a step. In other words, the remaining bottom surface of a recess 6a and the side surface of the cavity 17b formed in the bottom surface of the recess 6a are adjacent to one another such that an edge is formed.

The remaining bottom surface of the recesses 6a and side surfaces of the cavities 17b are covered with the barrier layer. A bottom surface of the cavities 17a forms the growth surface 9 of the growth layer 5 for the semiconductor layer stacks 7.

For example, the optoelectronic component 1 can be formed after the semiconductor layer stacks 7 have been deposited. Furthermore, it is possible to generate a plurality of optoelectronic components 1 by a separation process after the introduction of the semiconductor layer stacks.

Figure 6:
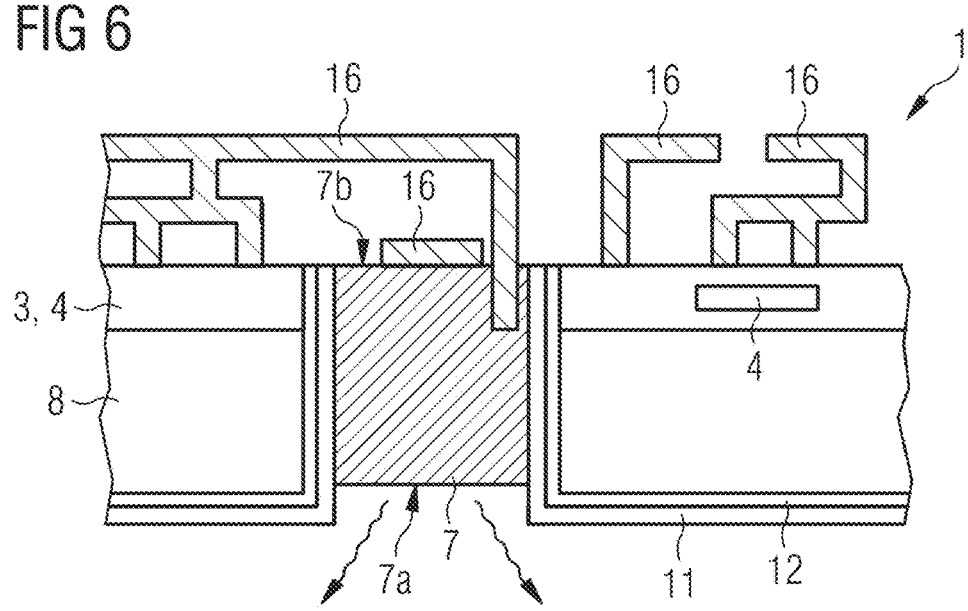
FIG. 6 is a schematic sectional view of an optoelectronic component according to an example.

The optoelectronic component 1 according to the example of FIG. 6 comprises an epitaxial semiconductor layer stack 7, a functional semiconductor layer 3 having an electronic control element 4 for controlling the semiconductor layer stack 4, and an insulating connection layer 8. The functional semiconductor layer 3 and the insulating connection layer 8 are arranged adjacent to the semiconductor layer stack 7 so that the functional semiconductor layer 3 does not overlap with a first main surface of the semiconductor layer stack 7a in plan view.

In this example, the semiconductor layer stack 7 has an active zone which generates or detects electromagnetic radiation during operation. The first main surface 7a is formed as a radiation transmission surface that can, for example, have grinding and/or polishing marks or etching marks from a planarization process.

Furthermore, electrically conductive connections 16 are applied on the second main surfaces of the semiconductor layer stacks 7b. In this example, the electrically conductive connections 16 electrically conductively connect the second main surfaces of the semiconductor layer stacks 7b to the functional semiconductor layer 3. The at least one electronic control element 4 comprises, for example, an integrated circuit.

Further, a reflective layer 12 is arranged between the barrier layer 11 and the semiconductor layer stack 7. The reflective layer 12 and the barrier layer 11 are arranged around the first main surface of the semiconductor layer stack 7a and completely surround the first main surface of the semiconductor layer stack 7a. The reflective layer 12 completely covers a bottom surface of the insulating connection layer.

Figure 7:
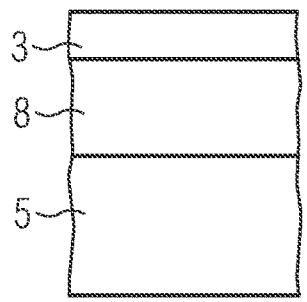
FIGS. 7, 8, 9, 10, 11 and 12 are schematic sectional views of steps of a method of producing an optoelectronic component according to an example.
Figure 8:
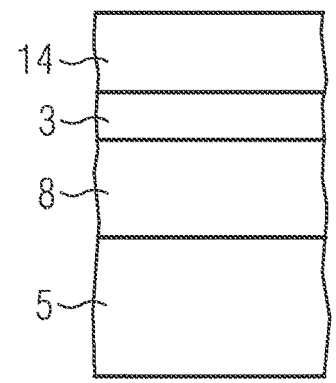

In the method according to the example of FIGS. 7 to 12, a semiconductor wafer 2 is provided analogously to FIG. 1 (FIG. 7). Then, as shown in FIG. 8, a protective layer 14 is applied on the functional semiconductor layer 3. The protective layer 14 is applied on a top surface of the functional semiconductor layer 3 facing away from the growth layer 5.

Figure 9:
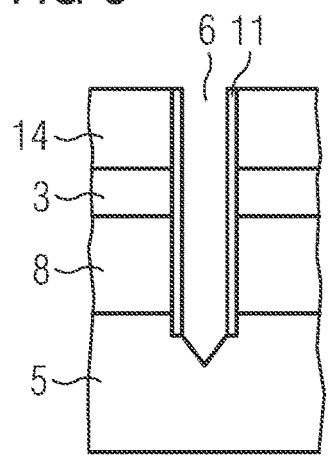

In a next method step, the recesses 6 are generated, as shown in FIG. 9. In contrast to FIG. 4, the recesses 6 completely penetrate the protective layer 14, the functional semiconductor layer 3 and the insulating connection layer 8.

Figure 10:
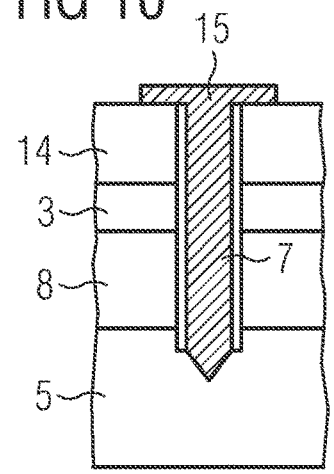

According to FIG. 10, in a next method step, a plurality of semiconductor layer stacks 7 are initially epitaxially grown on the exposed growth layer 5. In this example, the second main surfaces 7b are arranged in the vertical direction in the region of the protective layer 14. Subsequently, an epitaxial semiconductor layer sequence 15 is deposited by laterally overgrowing the protective layer 14. The second main surfaces 7b form a further growth surface for the semiconductor layer sequence 15.

Figure 11:
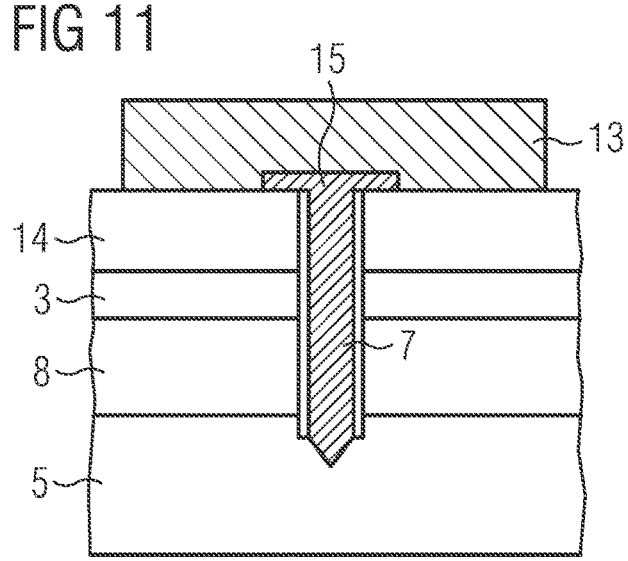

In a further method step, the produced arrangement is arranged on an auxiliary carrier 13 as shown in FIG. 11. The arrangement is arranged on the auxiliary carrier 13 with the second main surfaces 7b or with the semiconductor layer sequence 15 in front.

Figure 12:
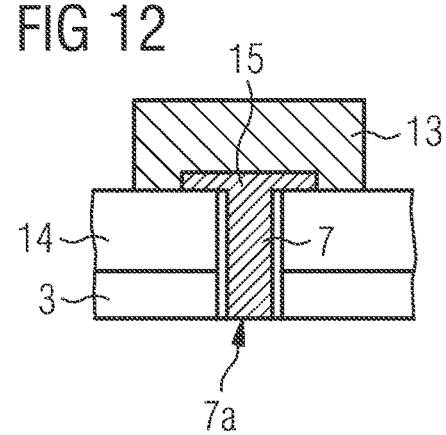

Subsequently, the growth layer 5 and the insulating connection layer 8 as well as a part of the semiconductor layer stack 7 are removed as shown in FIG. 12. The removal exposes the first main surface of the semiconductor layer stack 7a. The first main surface of the semiconductor layer stack 7a is in a common plane with a bottom surface of the functional semiconductor layer 3.

Figure 13:
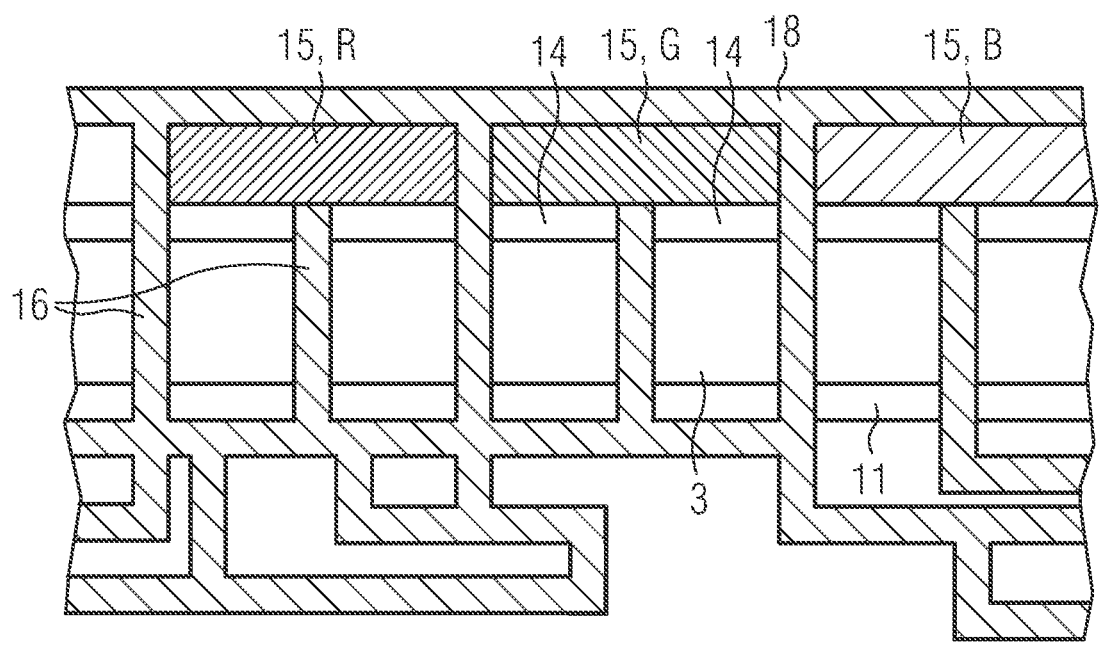
FIG. 13 is a schematic sectional view of an optoelectronic component according to an example.

In contrast to FIG. 6, the optoelectronic component 1 according to the example of FIG. 13 has a semiconductor layer sequence 15 on the epitaxial semiconductor layer stack 7 (not shown here). In this example, the semiconductor layer sequence 15 has an active zone which generates or detects electromagnetic radiation during operation.

Furthermore, a contact layer 18 is applied over the semiconductor layer sequence 15. Preferably, the contact layer 18 is a transparent conductive oxide (TCO).

Furthermore, electrically conductive connections 16 are applied on the semiconductor layer sequence 15 and the contact layer 18. In this example, the electrically conductive connections 16 connect the contact layer 18 and the semiconductor layer sequence 15 in an electrically conductive manner to the functional semiconductor layer 3.

In this example, the epitaxial semiconductor layer sequence 15 is structured and comprises various elements R, G, B. Elements R, G, B of the semiconductor layer sequence 15 are configured, for example, to emit light of red R, green G and blue B color.

This application claims priority of DE 10 2019 100 521.3, the disclosure of which is hereby incorporated by reference.

My methods and components are not limited to the examples by the description based thereon. Rather, this disclosure encompasses any new feature as well as any combination of features, which in particular includes any combination of features in the appended claims, even if the feature or combination itself is not explicitly indicated in the claims or examples.

The invention claimed is:

1. A method of producing an optoelectronic component comprising:
providing a semiconductor wafer with a functional semiconductor layer that has electronic control elements, and a growth layer;
generating a plurality of recesses in the semiconductor wafer exposing the growth layer in places; and
epitaxially growing a plurality of semiconductor layer stacks on the exposed growth layer, wherein
a surface of the exposed growth layer is used as a growth surface for the semiconductor layer stacks, and
the growth surface is inclined to a main extension plane of the semiconductor wafer, wherein the growth layer is removed such that the first main surfaces of the epitaxial semiconductor layer stacks are exposed and, when the growth layer is removed, a part of the semiconductor layer stacks is removed so that the first main surfaces of the semiconductor layer stacks are planarized.

2. The method according to claim 1, wherein at least one electronic control element comprises an integrated circuit.

3. The method according to claim 1, wherein an insulating connection layer is arranged between the functional semiconductor layer and the growth layer.

4. The method according to claim 1, wherein the growth surface has a {111} oriented surface.

5. The method according to claim 4, wherein the growth surface extends parallel to a main extension plane of the semiconductor wafer.

6. The method according to claim 1, wherein a barrier layer is applied over a side surface of the recesses.

7. The method according to claim 1, wherein a reflective layer is applied over a side surface of the recesses.

8. The method according to claim 1, wherein the epitaxial semiconductor layer stacks are arranged on an auxiliary carrier before removing the growth layer.

9. The method according to claim 1, wherein a protective layer is applied on the functional semiconductor layer before generating the recesses.

10. The method according to claim 9, further comprising an epitaxial semiconductor layer sequence deposited by lateral overgrowth of the protective layer.

11. The method according to claim 1, wherein electrically conductive connections are applied on the semiconductor layer stacks and the functional semiconductor layer, and electrically conductively connect the semiconductor layer stacks and the functional semiconductor layer to one another.

12. An optoelectronic component comprising:
an epitaxial semiconductor layer stack having an active zone that generates or detects electromagnetic radiation during operation;
an epitaxial semiconductor layer sequence; and
a functional semiconductor layer having an electronic control element that controls the epitaxial semiconductor layer stack, wherein
the functional semiconductor layer is arranged adjacent to the epitaxial semiconductor layer stack,
the functional semiconductor layer does not overlap with a first main surface of the epitaxial semiconductor layer stack in plan view, wherein the first main surface is formed as a radiation transmission surface, and
the optoelectronic component is free of a growth layer,
the epitaxial semiconductor layer sequence is arranged over the epitaxial semiconductor layer stack and the functional semiconductor layer, and
the epitaxial semiconductor layer sequence has an active zone which generates or detects electromagnetic radiation during operation.

13. The optoelectronic component according to claim 12, wherein a protective layer is arranged between the functional semiconductor layer and the epitaxial semiconductor layer sequence.

14. An optoelectronic component comprising:
an epitaxial semiconductor layer stack;
a functional semiconductor layer having an electronic control element that controls the epitaxial semiconductor layer stack; and
an epitaxial semiconductor layer sequence arranged over the epitaxial semiconductor layer stack and the functional semiconductor layer, wherein the functional semiconductor layer is arranged adjacent to the epitaxial semiconductor layer stack,
the functional semiconductor layer does not overlap with a first main surface of the semiconductor layer stack in plan view, and
the optoelectronic component is free of a growth layer, wherein the first main surface is formed as a radiation transmission surface, and
the epitaxial semiconductor layer stack has an active zone that generates or detects electromagnetic radiation during operation.

\* \* \* \* \*